(12) United States Patent
Piekny

(10) Patent No.: US 10,364,601 B2
(45) Date of Patent: Jul. 30, 2019

(54) PHOTOVOLTAIC SOLAR SHADE

(71) Applicant: Karma Automotive, LLC, Costa Mesa, CA (US)

(72) Inventor: Mark G. Piekny, Newport Beach, CA (US)

(73) Assignee: KARMA AUTOMOTIVE LLC, Irvine, CA (US)

( * ) Notice: Subject to any disclaimer, the term of this patent is extended or adjusted under 35 U.S.C. 154(b) by 0 days.

(21) Appl. No.: 15/169,132

(22) Filed: May 31, 2016

(65) Prior Publication Data

US 2017/0342771 A1    Nov. 30, 2017

(51) Int. Cl.
| | | |
|---|---|---|
| *E06B 9/42* | (2006.01) | |
| *B60J 1/20* | (2006.01) | |
| *E06B 9/72* | (2006.01) | |
| *E06B 9/78* | (2006.01) | |
| *H02S 10/40* | (2014.01) | |
| *H02S 20/22* | (2014.01) | |
| *E06B 9/24* | (2006.01) | |

(52) U.S. Cl.
CPC ............... *E06B 9/42* (2013.01); *B60J 1/2019* (2013.01); *B60J 1/2041* (2013.01); *E06B 9/72* (2013.01); *E06B 9/78* (2013.01); *H02S 10/40* (2014.12); *H02S 20/22* (2014.12); *E06B 2009/2476* (2013.01); *Y02B 10/10* (2013.01); *Y02T 10/90* (2013.01)

(58) Field of Classification Search
CPC ...... B60J 1/2016; B60J 1/2019; B60J 1/2013; B60J 1/2041; E06B 2009/2476; E06B 9/42; E06B 9/72; E06B 9/78; H02J 7/35; B60R 7/12; H01L 31/04; H02S 10/40; H02S 20/22; Y02B 10/10; Y02T 10/90

USPC ................... 160/127, 370.22; 296/97.7, 97.8
See application file for complete search history.

(56) References Cited

U.S. PATENT DOCUMENTS

| | | | | |
|---|---|---|---|---|
| 4,636,579 A | * | 1/1987 | Hanak | H02S 30/20 136/245 |
| 4,838,334 A | * | 6/1989 | Hogg | B60J 1/2091 160/370.23 |
| 5,100,194 A | * | 3/1992 | Decker | B60J 1/2011 160/370.21 |
| 5,433,259 A | * | 7/1995 | Faludy | B60P 3/343 136/245 |
| 6,812,397 B2 | * | 11/2004 | Lambey | E04F 10/06 136/244 |
| 7,472,739 B2 | * | 1/2009 | Heidenreich | E04F 10/0648 160/122 |
| 7,576,282 B2 | * | 8/2009 | Heidenreich | E04F 10/06 136/243 |
| 7,618,079 B2 | | 11/2009 | Rawat | |

(Continued)

FOREIGN PATENT DOCUMENTS

JP    2008055955    *    3/2008    ............... B60R 7/12

*Primary Examiner* — Daniel P Cahn
(74) *Attorney, Agent, or Firm* — Gordon & Rees LLP

(57) ABSTRACT

There are provided various implementations of a solar shade for covering a transmissive panel such as a window, door, sunroof or skylight of a vehicle, building, or home. Such a solar shade includes a photovoltaic sheet, which may be a flexible sheet. The solar shade is configured to absorb heat produced due to sunlight transmitted through the transmissive panel and impinging on the solar shade. The photovoltaic sheet is configured to generate an electrical current using the sunlight.

19 Claims, 6 Drawing Sheets

(56) References Cited

U.S. PATENT DOCUMENTS

| | | | |
|---|---|---|---|
| 8,674,211 B1* | 3/2014 | Palmer | H02S 30/20 136/244 |
| 8,704,079 B2* | 4/2014 | Nocito | E04F 10/06 136/245 |
| 9,173,493 B1* | 11/2015 | Fulton | A47C 7/66 |
| 9,789,949 B2* | 10/2017 | Hontz | B64D 47/00 |
| 9,949,597 B2* | 4/2018 | Tsibulevskiy | A47K 3/36 |
| 9,955,825 B2* | 5/2018 | Tsibulevskiy | A47K 3/36 |
| 9,966,765 B1* | 5/2018 | Leabman | H02J 50/23 |
| 2003/0070767 A1* | 4/2003 | Workman | E06B 9/32 160/84.04 |
| 2006/0028166 A1* | 2/2006 | Closset | H02J 7/355 320/101 |
| 2006/0055201 A1 | 3/2006 | Neuer | |
| 2006/0076048 A1* | 4/2006 | Gaudiana | H01G 9/2031 136/246 |
| 2007/0012349 A1* | 1/2007 | Gaudiana | G06Q 30/00 136/244 |
| 2009/0139562 A1* | 6/2009 | Thomas | H02S 30/10 136/245 |
| 2010/0154860 A1* | 6/2010 | Fereday | F16M 11/10 136/245 |
| 2010/0243180 A1* | 9/2010 | Hoberman | E04B 1/86 160/218 |
| 2011/0048656 A1* | 3/2011 | Chu | E06B 9/28 160/310 |
| 2011/0088855 A1* | 4/2011 | Boustani | B60J 11/02 160/370.22 |
| 2011/0133655 A1* | 6/2011 | Recker | H02J 9/02 315/159 |
| 2011/0226425 A1* | 9/2011 | Forbis | E04B 1/80 160/127 |
| 2011/0253319 A1* | 10/2011 | Schaupp | E06B 9/262 160/127 |
| 2012/0073624 A1* | 3/2012 | Nocito | E04F 10/0633 136/245 |
| 2013/0026726 A1* | 1/2013 | Thomas | A45C 5/14 280/43.1 |
| 2013/0092562 A1* | 4/2013 | Wyner | A45C 11/00 206/45.23 |
| 2013/0169069 A1* | 7/2013 | Stone | H02J 1/00 307/150 |
| 2014/0015470 A1* | 1/2014 | Lim | H02J 7/35 320/101 |
| 2014/0027069 A1* | 1/2014 | Oppizzi | E06B 9/40 160/6 |
| 2014/0145668 A1* | 5/2014 | Scheucher | H02J 7/35 320/101 |
| 2014/0216511 A1* | 8/2014 | Brown | E04H 15/14 135/93 |
| 2014/0224434 A1* | 8/2014 | Gross | E06B 9/42 160/127 |
| 2014/0338846 A1* | 11/2014 | Hikmet | G09F 9/372 160/310 |
| 2015/0068690 A1* | 3/2015 | Howie | E06B 9/42 160/241 |
| 2015/0107783 A1* | 4/2015 | Chen | B60J 1/2052 160/2 |
| 2015/0204561 A1* | 7/2015 | Sadwick | G05D 23/1905 236/1 C |
| 2015/0216273 A1* | 8/2015 | Akin | B23P 15/26 135/16 |
| 2016/0053535 A1* | 2/2016 | Birkestrand | E06B 9/262 160/218 |
| 2016/0137282 A1* | 5/2016 | Hontz | B64D 47/00 244/129.3 |
| 2016/0143486 A1* | 5/2016 | Tsibulevskiy | A47K 3/38 29/428 |
| 2016/0186490 A1* | 6/2016 | Teuscher | E06B 9/367 160/181 |
| 2016/0221441 A1* | 8/2016 | Hall | B60L 1/00 |
| 2017/0040932 A1* | 2/2017 | Lillywhite | H02S 20/30 |
| 2017/0042349 A1* | 2/2017 | Batros | A47G 9/062 |
| 2017/0079481 A1* | 3/2017 | Tsibulevskiy | A47K 3/281 |
| 2017/0079482 A1* | 3/2017 | Tsibulevskiy | A47K 3/281 |
| 2017/0238401 A1* | 8/2017 | Sadwick | H05B 37/0281 315/294 |

* cited by examiner

PHOTOVOLTAIC SOLAR SHADE

BACKGROUND

The transition away from the use of petroleum as a primary source of energy has resulted in the increasing reliance on electrical power delivered via the electrical grid. For example, in addition to its use in powering air-conditioning and heating systems, machinery, and appliances in homes and businesses, electrical energy is increasingly being used to power automobiles and other types of vehicles.

Although electrical power is often perceived as clean by consumers due to the absence of perceivable environmental impact at the point at which it is used, electrical power is in fact typically generated by the combustion of coal and natural gas. As a result, it would be desirable to reduce reliance on electrical power delivered over the electrical grid through substitution of that grid power by electrical power generated cleanly and renewably, at or near its point of use. For instance, solar power generated at home, on site by a business, or onboard by a vehicle, may advantageously be used to reduce the consumption of electrical power obtained from commonly used and relatively dirty sources such as coal and natural gas.

SUMMARY

The present disclosure is directed to photovoltaic solar shades, substantially as shown in and/or described in connection with at least one of the figures, and as set forth more completely in the claims.

DETAILED DESCRIPTION

Figure 1:
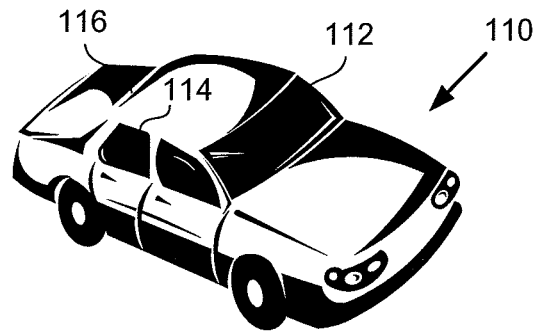
FIG. 1 shows exemplary environments for use of photovoltaic solar shades, according to one implementation of the present disclosure.
Figure 1:
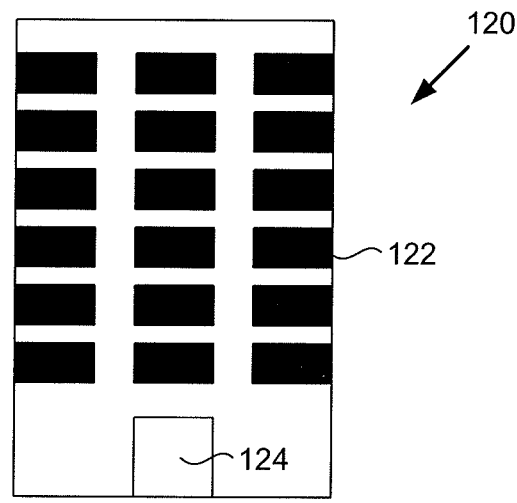
Figure 1:

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The present application addresses the electrical power generation challenges described above by disclosing a photovoltaic solar shade capable of providing clean and renewable, locally generated electrical power, while concurrently providing interior cooling for a home, building, or vehicle. As disclosed in the present application, a solar shade according to the present inventive principles includes a photovoltaic sheet that may be deployed, such as by being unfurled or otherwise extended, and may also be retracted. The solar shade may be used to cover a transmissive panel, such as a glass door, window, or sunroof, for example, and is configured to absorb heat produced due to sunlight impinging on the solar shade. In addition, the photovoltaic sheet of the solar shade is configured to generate an electrical current using that impinging sunlight. As a result, the photovoltaic solar shade disclosed in the present application can advantageously reduce reliance on electrical power delivered over a conventional electrical grid and obtained from commonly used and relatively dirty sources such as coal and natural gas.

FIG. 1 shows exemplary environments for use of photovoltaic solar shades, according to one implementation of the present disclosure. Illustrated in FIG. 1 are vehicle 110, building 120, and home 130. Each of vehicle 110, building 120, and home 130 includes multiple transmissive panels or surfaces that may be advantageously covered by a photovoltaic solar shade. It is noted that, as used in the present application, the term "transmissive panel" refers to any partially transparent or substantially transparent panel, such as a tinted or non-tinted window or glass door, for example. Thus, a transmissive panel may correspond to windshield 112, side windows 114, or rear window 116 of vehicle 110. In addition, although not explicitly shown in FIG. 1, in instances in which vehicle 110 is a hatchback type vehicle and/or includes a sunroof, a transmissive panel as used herein may correspond to a hatchback window or sunroof of vehicle 110.

A transmissive panel may also correspond to window 132 or a skylight (not shown in FIG. 1) of home 130, as well as to window 122, door 124, or a skylight (also not shown in FIG. 1) of building 120. The photovoltaic solar shades disclosed in the present application may be used to cover an interior surface of a transmissive panel of vehicle 110, building 120, or home 130, and are configured to absorb heat produced due to transmission of sunlight through the transmissive panel. In addition, the electrical current generated by the respective photovoltaic sheet of each solar shade can be used for a variety of purposes. For example, when a photovoltaic solar shade is utilized in building 120 or home 130, the electrical current generated by its photovoltaic sheet may be used to power a system in building 120 or home 130. Examples of systems in building 120 or home 130 that may be powered by such an electrical current include ventilation systems, lighting systems, entertainment systems, communications systems, computers, and the like.

Figure 2:
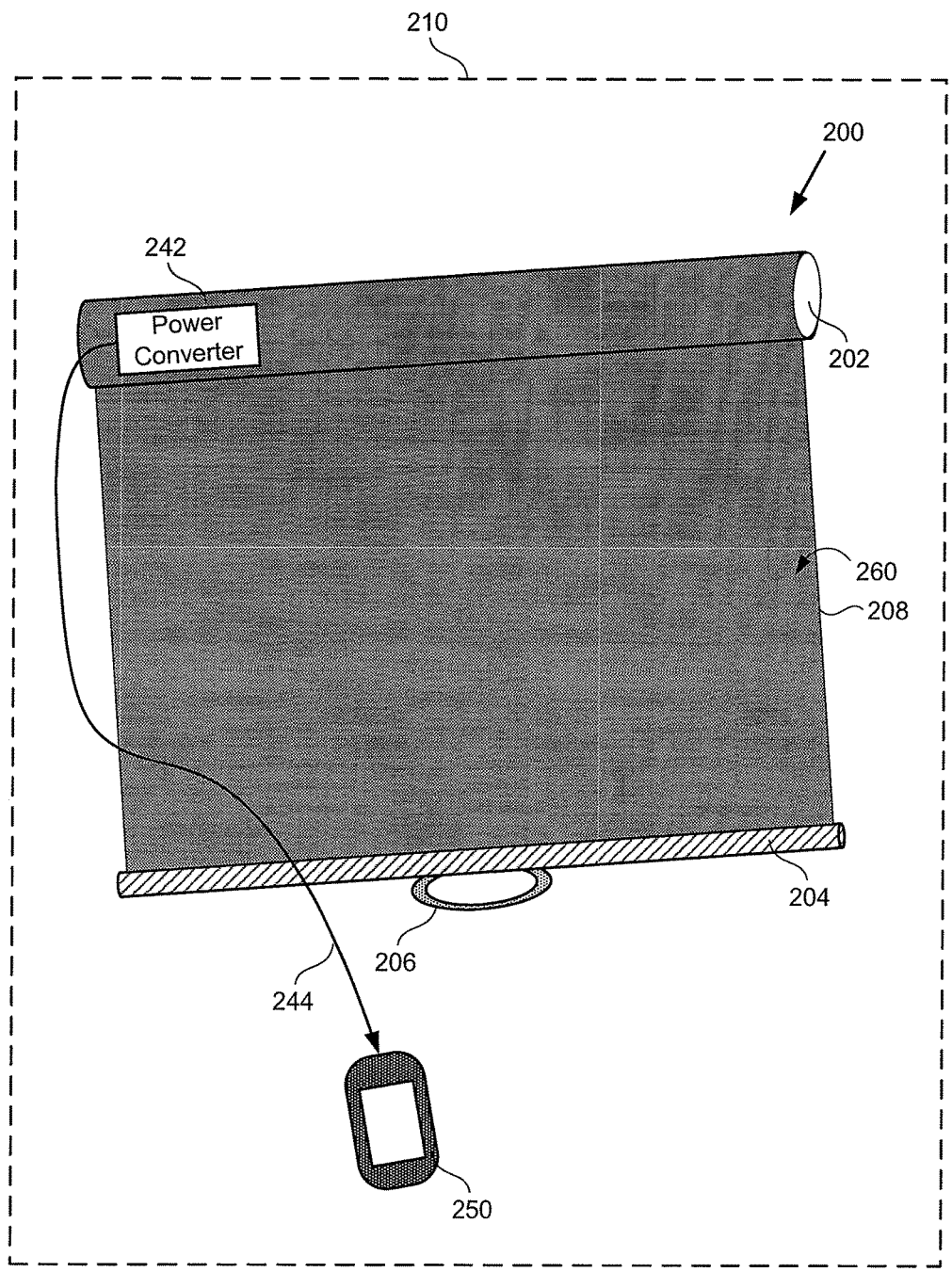
FIG. 2 shows an exemplary photovoltaic solar shade, according to one implementation of the present disclosure.

Referring to FIG. 2, FIG. 2 shows an exemplary photovoltaic solar shade, according to one implementation of the present disclosure. Solar shade 200 is depicted as being implemented within vehicle 210. Vehicle 210 corresponds in general to vehicle 110, in FIG. 1, and may share any of the characteristics attributed to that corresponding feature in the present application. Moreover, it is noted that although solar shade 200 is described in terms of its use within vehicle 210, that implementation is merely exemplary, and in other implementations, solar shade 200 may be used in conjunction with a transmissive panel of building 120 or home 130, shown in FIG. 1.

According to the implementation shown in FIG. 2, solar shade 200 includes photovoltaic sheet 208, roller assembly 202 for housing photovoltaic sheet 208 when solar shade 200 is retracted, optional support element 204, and handle 206 for use in manually deploying and retracting solar shade 200. Solar shade 200 also includes power converter 242, which, according to the present exemplary implementation, may be incorporated into roller assembly 202. Also shown in FIG. 2 are surface 260 of solar shade 200, and mobile device 250 within vehicle 210 and being powered via wired connection 244 with solar shade 200 using the current generated by photovoltaic sheet 208.

Solar shade 200 may be manually deployed and retracted using handle 206 and roller assembly 202. When solar shade 200 is retracted, photovoltaic sheet 208 is partially or fully furled into or onto roller assembly 202. That is to say, according to the present exemplary implementation, photovoltaic solar sheet 208 is a flexible sheet capable of being rolled-up and unrolled. In one implementation, for example, photovoltaic solar sheet 208 may include amorphous silicon formed on a flexible substrate, such as a polymer substrate.

Electrical current generated by photovoltaic sheet 208 may be used for a variety of different purposes within vehicle 210. Moreover, power converter 242 receives the current generated by photovoltaic sheet 208, and may be used to appropriately step up or step down a voltage for powering a system within vehicle 210. In one implementation, and as shown in FIG. 2, the electrical current generated by photovoltaic sheet 208 may be used to power or charge mobile device 250, which may be a smartphone, digital media player, or tablet computer, for example, via wired connection 244 with solar shade 200. However, in other implementations, the electrical current generated by photovoltaic sheet 208 may be used to power or charge other systems within vehicle 210. Examples of systems within vehicle 210 that may be powered by the electrical current generated by photovoltaic sheet 208 include a battery of vehicle 210, such as a twelve volt (12V) automotive battery, or a ventilation system of vehicle 210, for instance cooling fans within vehicle 210.

Thus, solar shade 200 may be used to cover an interior surface of a transmissive panel, such as a side window, rear window, windshield, hatchback window, or sunroof of vehicle 210. Solar shade 200 is configured to absorb heat produced due to transmission of sunlight through the transmissive panel of vehicle 210 that solar shade 200 covers, thereby reducing the temperature within vehicle 210. In addition, photovoltaic sheet 208 is configured to generate an electrical current using the sunlight impinging on surface 260 of solar shade 200, thereby advantageously providing a clean and renewable energy source for use in vehicle 210.

Figure 3:
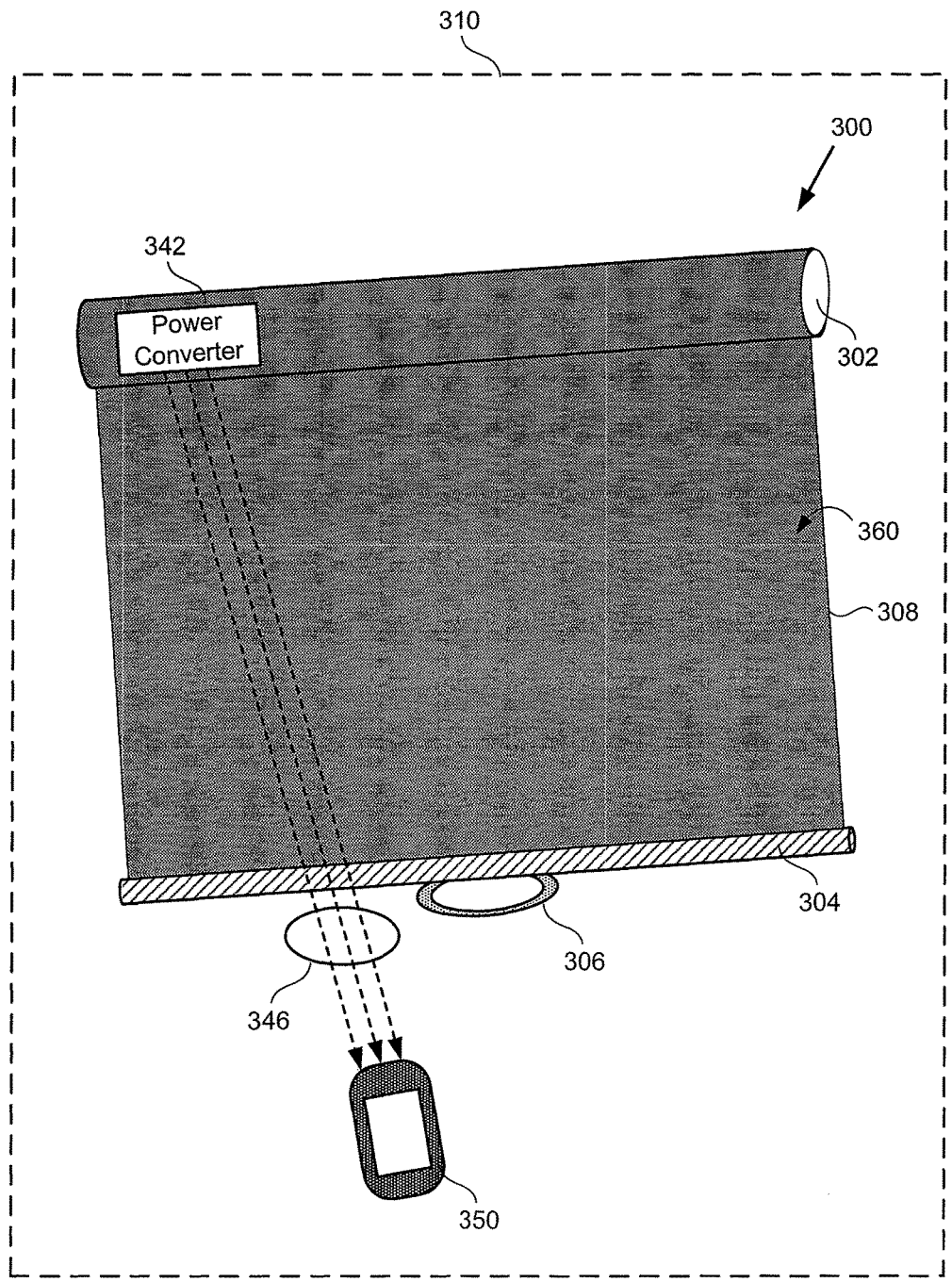
FIG. 3 shows an exemplary photovoltaic solar shade, according to another implementation of the present disclosure.

Continuing to FIG. 3, FIG. 3 shows an exemplary photovoltaic solar shade, according to another implementation of the present disclosure. Like solar shade 200, in FIG. 2, solar shade 300 is depicted as being implemented within vehicle 310. Vehicle 310 corresponds in general to vehicle 110, in FIG. 1, and may share any of the characteristics attributed to that corresponding feature in the present application. Moreover, it is noted that although solar shade 300 is described in terms of its use within vehicle 310, that implementation is merely exemplary, and in other implementations, solar shade 300 may be used in conjunction with a transmissive panel of building 120 or home 130, shown in FIG. 1.

According to the implementation shown in FIG. 3, solar shade 300 includes photovoltaic sheet 308, roller assembly 302 for housing photovoltaic sheet 308 when solar shade 300 is retracted, optional support element 304, and handle 306 for use in manually deploying and retracting solar shade 300. Solar shade 300 also includes power converter 342, which, according to the present exemplary implementation, may be incorporated into roller assembly 302. Also shown in FIG. 3 are surface 360 of solar shade 300, and mobile device 350 within vehicle 310 being powered or charged via wireless power transmission 346 from solar shade 300 using the current generated by photovoltaic sheet 308.

Photovoltaic sheet 308, handle 306, roller assembly 302, and power converter 342 correspond in general to photovoltaic sheet 208, handle 206, roller assembly 202, and power converter 242, in FIG. 2, and may share any of the characteristics attributed to those corresponding features in the present application. In addition, mobile device 350, in FIG. 3, corresponds in general to mobile device 250, in FIG. 2, and may share any of the characteristics attributed to that corresponding feature in the present application.

Solar shade 300 may be manually deployed and retracted using handle 306 and roller assembly 302. When solar shade 300 is retracted, photovoltaic sheet 308 is partially or fully furled into or onto roller assembly 302. Thus, photovoltaic solar sheet 308 is a flexible sheet capable of being rolled-up and unrolled, and may be implemented using amorphous silicon formed on a polymer or other flexible substrate material.

Electrical current generated by photovoltaic sheet 308 may be used for a variety of different purposes within vehicle 310. In one implementation, and as shown in FIG. 3, the electrical current generated by photovoltaic sheet 308 may be used to power or charge mobile device 350 via wireless power transmission 346 from solar shade 300. That is to say, solar shade 300 may be configured to transmit power to mobile device 350 wirelessly, for example in the form of radio frequency (RF) beams or signals, as wireless power transmission 346.

Thus, solar shade 300 may be used to cover an interior surface of a transmissive panel, such as a side window, rear window, windshield, hatchback window, or sunroof of vehicle 310. Solar shade 300 is configured to absorb heat produced due to transmission of sunlight through the transmissive panel of vehicle 310 that solar shade 300 covers, thereby reducing the temperature within vehicle 310. In addition, photovoltaic sheet 308 is configured to generate an electrical current using the sunlight impinging on surface 360 of solar shade 300, thereby advantageously providing a clean and renewable energy source for use in vehicle 310.

Figure 4:
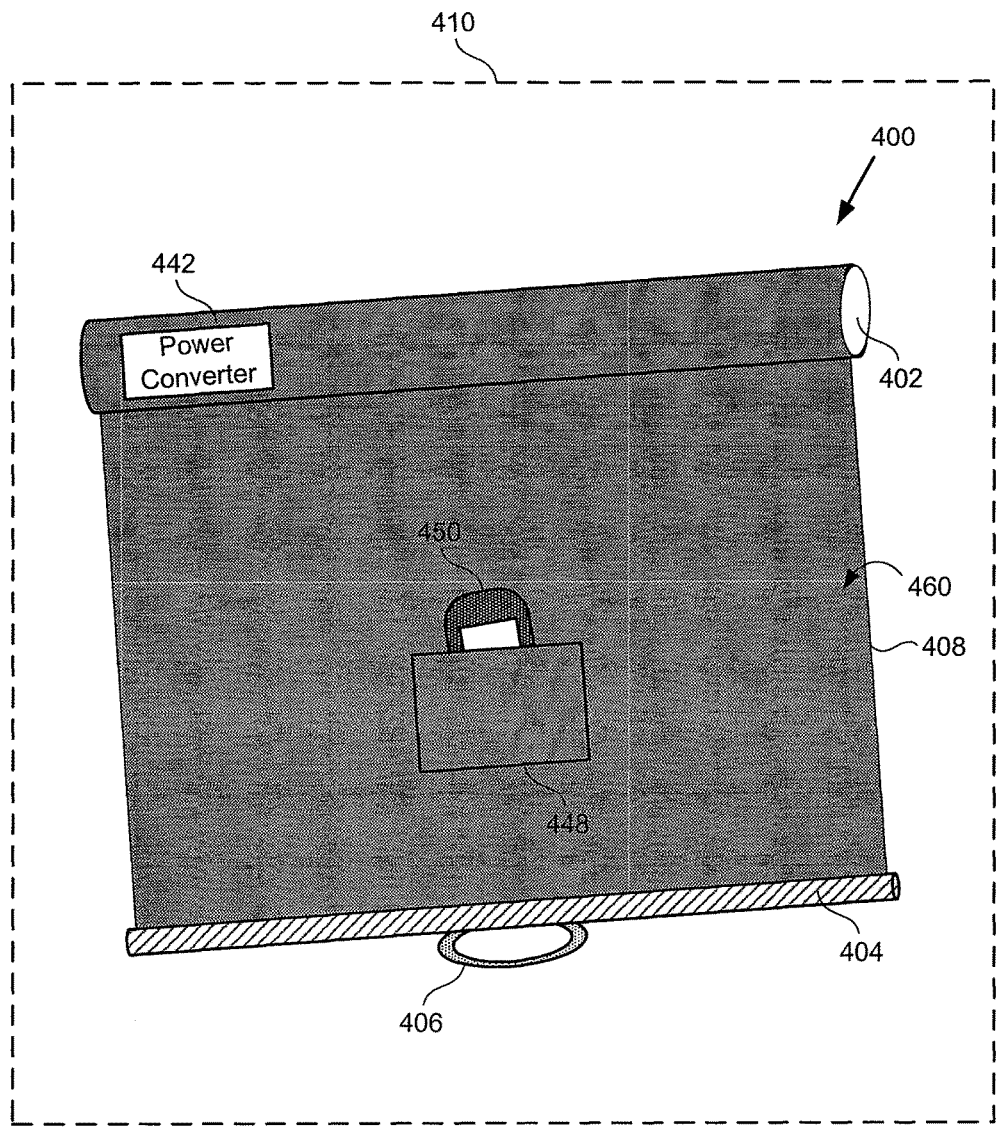
FIG. 4 shows an exemplary photovoltaic solar shade, according to another implementation of the present disclosure.

Moving to FIG. 4, FIG. 4 shows an exemplary photovoltaic solar shade, according to another implementation of the present disclosure. Like solar shade 200/300, in FIG. 2/3, solar shade 400 is depicted as being implemented within vehicle 410. Vehicle 410 corresponds in general to vehicle 110, in FIG. 1, and may share any of the characteristics attributed to that corresponding feature in the present application. Moreover, it is noted that although solar shade 400 is described in terms of its use within vehicle 410, that implementation is merely exemplary, and in other implementations, solar shade 400 may be used in conjunction with a transmissive panel of building 120 or home 130, shown in FIG. 1.

According to the implementation shown in FIG. 4, solar shade 400 includes photovoltaic sheet 408, roller assembly 402 for housing photovoltaic sheet 408 when solar shade 400 is retracted, optional support element 404, and handle 406 for use in manually deploying and retracting solar shade 400. Solar shade 400 also includes power converter 442, which, according to the present exemplary implementation, may be incorporated into roller assembly 402. Also shown in FIG. 4 are surface 460 of solar shade 400, pocket 448 at surface 460 of solar shade 400, and mobile device 450 within pocket 448 being powered inductively by solar shade 400 using the current generated by photovoltaic sheet 408.

Photovoltaic sheet 408, handle 406, roller assembly 402, and power converter 442 correspond in general to photovoltaic sheet 208, handle 206, roller assembly 202, and power converter 242, in FIG. 2, and may share any of the characteristics attributed to those corresponding features in the present application. In addition, mobile device 450, in FIG. 4, corresponds in general to mobile device 250, in FIG. 2, and may share any of the characteristics attributed to that corresponding feature in the present application.

Solar shade 400 may be manually deployed and retracted using handle 406 and roller assembly 402. When solar shade 400 is retracted, photovoltaic sheet 408 is partially or fully furled into or onto roller assembly 402. Thus, photovoltaic solar sheet 408 is a flexible sheet capable of being rolled-up and unrolled, and may be implemented using amorphous silicon formed on a polymer or other flexible substrate material.

Electrical current generated by photovoltaic sheet 408 may be used for a variety of different purposes within vehicle 410. In one implementation, and as shown in FIG. 4, the electrical current generated by photovoltaic sheet 408 may be used to power or charge mobile device 450 inductively. For example, and as further shown in FIG. 4, mobile device 450 may be situated in close proximity to surface 460 of solar shade 400 by being placed in pocket 448. Alternatively, in some implementations, mobile device 450 may be placed directly on surface 460, or placed in another type of enclosure attached to surface 460 to enable inductive power transfer to mobile device 450 from solar shade 400.

Thus, solar shade 400 may be used to cover an interior surface of a transmissive panel, such as a side window, rear window, windshield, hatchback window, or sunroof of vehicle 410. Solar shade 400 is configured to absorb heat produced due to transmission of sunlight through the transmissive panel of vehicle 410 that solar shade 400 covers, thereby reducing the temperature within vehicle 410. In addition, photovoltaic sheet 408 is configured to generate an electrical current using the sunlight impinging on surface 460 of solar shade 400, thereby advantageously providing a clean and renewable energy source for use in vehicle 410.

Figure 5:
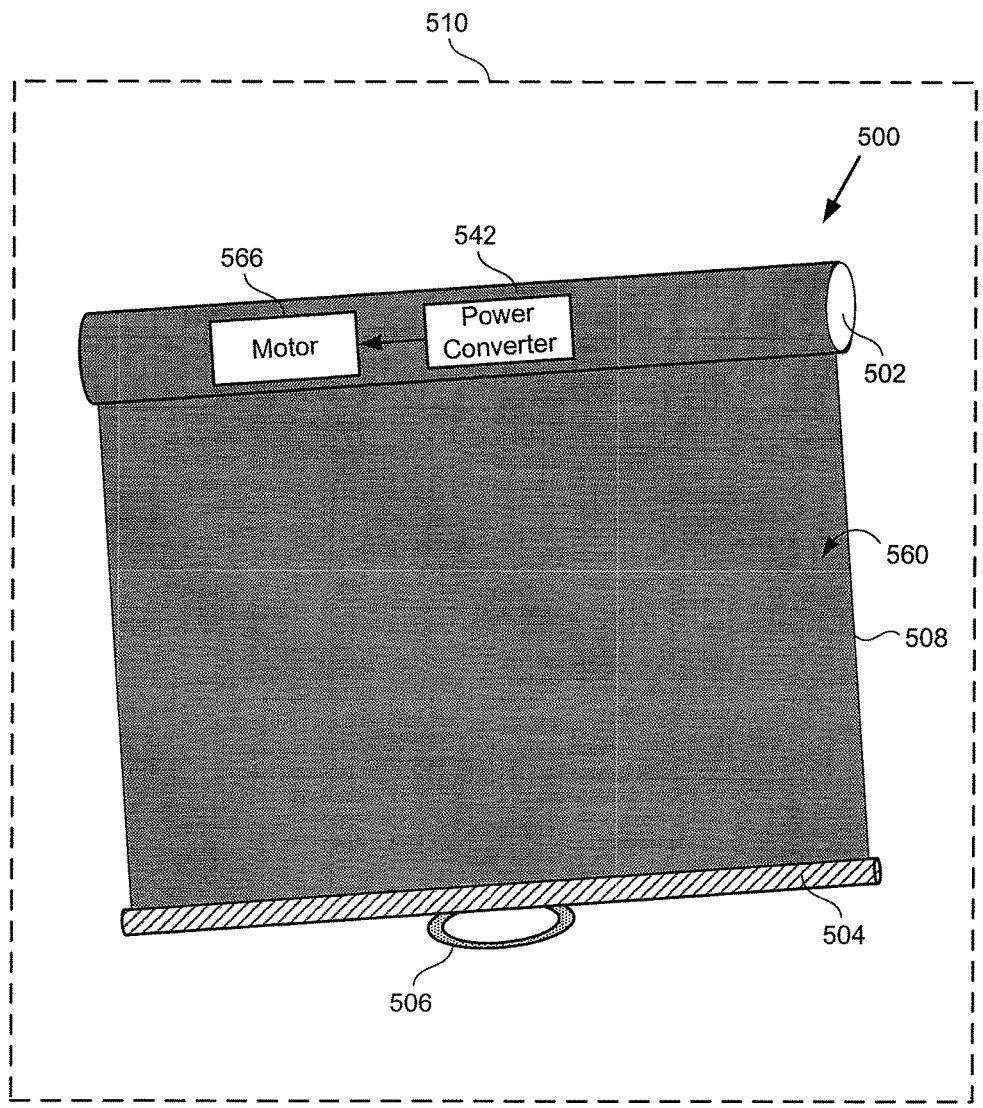
FIG. 5 shows an exemplary photovoltaic solar shade, according to yet another implementation of the present disclosure.

Referring to FIG. 5, FIG. 5 shows an exemplary photovoltaic solar shade, according to yet another implementation of the present disclosure. Like solar shade 200/300/400, in FIG. 2/3/4, solar shade 500 is depicted as being implemented within vehicle 510. Vehicle 510 corresponds in general to vehicle 110, in FIG. 1, and may share any of the characteristics attributed to that corresponding feature in the present application. Moreover, it is noted that although solar shade 500 is described in terms of its use within vehicle 510, that implementation is merely exemplary, and in other implementations, solar shade 500 may be used in conjunction with a transmissive panel of building 120 or home 130, shown in FIG. 1.

According to the implementation shown in FIG. 5, solar shade 500 includes photovoltaic sheet 508, roller assembly 502 for housing photovoltaic sheet 508 when solar shade 500 is retracted, optional support element 504, and optional handle 506 for use in manually deploying and retracting solar shade 500. Solar shade 500 also power converter 542, and motor 566 for deploying and/or retracting solar shade 500. Also shown in FIG. 5 is surface 560 of solar shade 500.

Photovoltaic sheet 508, optional handle 506, and power converter 542 correspond in general to photovoltaic sheet 208, handle 206, and power converter 242, in FIG. 2, and may share any of the characteristics attributed to those corresponding features in the present application. In contrast to the implementations shown in FIGS. 2, 3, and 4, however, solar shade 500 includes motor 566, which, like power converter 542, may be incorporated into roller assembly 502.

Solar shade 500 may be deployed and retracted using motor 566. For example, a user of solar shade 500 may activate motor 566 and cause roller element 502 to furl or unfurl photovoltaic sheet 508 of solar shade 500. Thus, photovoltaic solar sheet 508 is a flexible sheet capable of being rolled-up and unrolled, and may be implemented using amorphous silicon formed on a polymer or other flexible substrate material.

As shown in FIG. 5, motor 566 may be driven by power converter 542 and may be powered using electrical current generated by photovoltaic sheet 508. In some implementations, activation of motor 566 may be automatic. For example, solar shade 500 may be configured such that in its retracted state photovoltaic sheet 508 is partially unfurled, leaving a portion of surface 560 exposed to sunlight. In such an implementation, photovoltaic sheet 508 might function in effect as a light sensor, and cause motor 566 to activate to partially or fully deploy solar shade 500 when the current generated by photovoltaic sheet 508 reaches a predetermined threshold current level.

Electrical current generated by photovoltaic sheet 508 may be used for a variety purposes within vehicle 510, in addition to driving motor 566. In some implementations, the electrical current generated by photovoltaic sheet 508 may be used to power or charge a mobile device or another system within vehicle 510 via a wired connection with solar shade 500 corresponding to wired connection 244, in FIG. 2. Examples of systems within vehicle 510 that may be powered by the electrical current generated by photovoltaic sheet 508 include a battery of vehicle 510, such as a 12V automotive battery, or a ventilation system of vehicle 510, for instance cooling fans within vehicle 510. Moreover, in other implementations, solar shade 500 may be adapted to power or charge a mobile device within vehicle 510 inductively, or wirelessly using RF beams.

Thus, solar shade 500 may be used to cover an interior surface of a transmissive panel, such as a side window, rear window, windshield, hatchback window, or sunroof of vehicle 510. Solar shade 500 is configured to absorb heat produced due to transmission of sunlight through the transmissive panel of vehicle 510 that solar shade 500 covers, thereby reducing the temperature within vehicle 510. In addition, photovoltaic sheet 508 is configured to generate an electrical current using the sunlight impinging on surface 560 of solar shade 500, thereby advantageously providing a clean and renewable energy source for use in vehicle 510.

Figure 6:
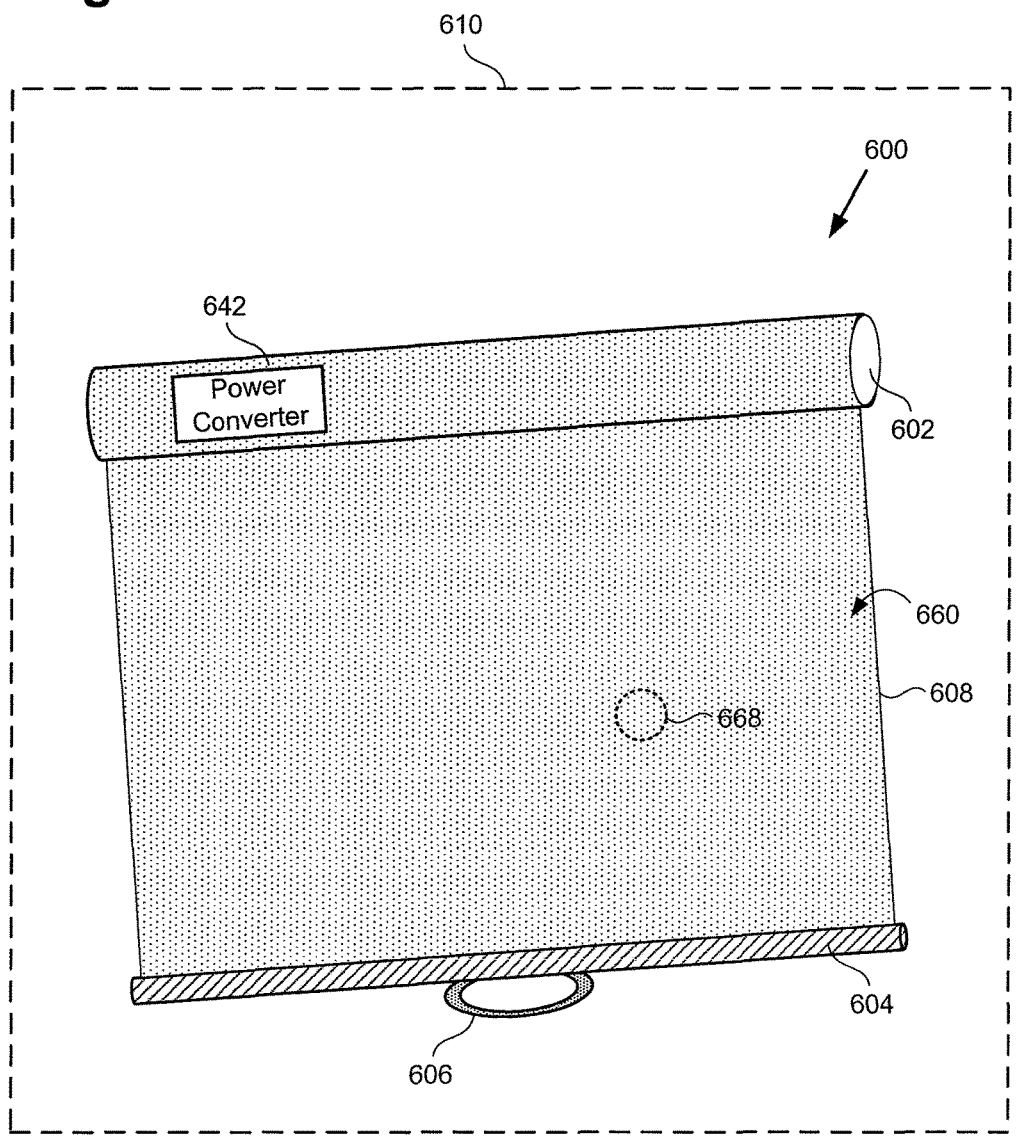
FIG. 6 shows an exemplary photovoltaic solar shade, according to another implementation of the present disclosure.

Continuing to FIG. 6, FIG. 6 shows an exemplary photovoltaic solar shade, according to another implementation of the present disclosure. Like solar shade 200/300/400/500, in FIG. 2/3/4/5, solar shade 600 is depicted as being implemented within vehicle 610. Vehicle 610 corresponds in general to vehicle 110, in FIG. 1, and may share any of the characteristics attributed to that corresponding feature in the present application. Moreover, it is noted that although solar shade 600 is described in terms of its use within vehicle 610, that implementation is merely exemplary, and in other implementations, solar shade 600 may be used in conjunction with a transmissive panel of building 120 or home 130, shown in FIG. 1.

According to the implementation shown in FIG. 6, solar shade 600 includes photovoltaic sheet 608 having perforations 668 formed therein, roller assembly 602 for housing photovoltaic sheet 608 when solar shade 600 is retracted, optional support element 604, and handle 606 for use in manually deploying and retracting solar shade 600. Solar shade 600 also includes power converter 642, which, according to the present exemplary implementation, may be incorporated into roller assembly 602. Also shown in FIG. 6 is surface 660 of solar shade 600.

Roller assembly 602, handle 606, and power converter 642 correspond in general to roller assembly 202, handle 206, and power converter 242, in FIG. 2, and may share any of the characteristics attributed to those corresponding features in the present application. In contrast to the implementations shown in FIGS. 2, 3, 4, and 5, however, photovoltaic sheet 608 of solar shade 600 includes perforations 668.

Solar shade 600 may be manually deployed and retracted using handle 606 and roller assembly 602. When solar shade 600 is retracted, photovoltaic sheet 608 is partially or fully furled into or onto roller assembly 602. Thus, photovoltaic solar sheet 608 is a flexible sheet capable of being rolled-up and unrolled, and may be implemented using amorphous silicon formed on a polymer or other flexible substrate material.

Perforations 668 may be formed in photovoltaic sheet 608 to enhance visibility through solar shade 600. Although the electrical current generating capacity of photovoltaic sheet 606 may be reduced due to the presence of perforations 668, in some implementations, the trade-off of reduced electrical current output for enhanced visibility may be advantageous or desirable. For example, if utilized in a rear window of vehicle 610 during operation of vehicle 610, the enhanced visibility due to perforations 668 may be highly desirable.

Electrical current generated by photovoltaic sheet 608 including perforations 668 may be used for a variety purposes within vehicle 610. In one implementation, for example, solar shade 600 may include a motor corresponding to motor 566, in FIG. 5, and the current generated by photovoltaic sheet 608 may be used to drive the motor, as described above. Alternatively, or in addition, the electrical current generated by photovoltaic sheet 608 may be used to power or charge a mobile device or another system within vehicle 610 via a wired connection with solar shade 600 corresponding to wired connection 244, in FIG. 2. Examples of systems within vehicle 610 that may be powered by the electrical current generated by photovoltaic sheet 608 include a battery of vehicle 610, such as a 12V automotive battery, or a ventilation system of vehicle 610, for instance cooling fans within vehicle 610. Moreover, in other implementations, solar shade 600 may be adapted to power or charge a mobile device within vehicle 610 inductively, or wirelessly using RF beams. Thus, like solar shade 200/300/400/500, solar shade 600 may be used to cover an interior surface of a transmissive panel, such as a side window, rear window, windshield, hatchback window, or sunroof of vehicle 610. Solar shade 600 is configured to absorb heat produced due to transmission of sunlight through the transmissive panel of vehicle 610 that solar shade 600 covers, thereby reducing the temperature within vehicle 610. In addition, photovoltaic sheet 608 is configured to generate an electrical current using the sunlight impinging on surface 660 of solar shade 600, thereby advantageously providing a clean and renewable energy source for use in vehicle 610.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

What is claimed is:

1. A vehicle comprising:
a transmissive panel; and
a solar shade assembly having a solar shade selectively covering the transmissive panel, wherein the solar shade assembly further comprises:
the solar shade including a continuous photovoltaic sheet configured to generate an electrical current using sunlight; and
a roller assembly including a housing for storing the photovoltaic sheet such that the photovoltaic sheet is capable of being unfurled from the roller assembly;
a pocket mounted on a surface of the photovoltaic sheet, wherein the pocket is configured to retain a mobile electronic device;
a power converter located in the roller assembly and configured to receive the electrical current;
wherein the power converter is configured to provide power to the pocket for charging the mobile electronic device placed within the pocket; and
wherein the power converter is configured to provide power to the roller assembly to drive furling of the continuous photovoltaic sheet into the housing.

2. The vehicle of claim 1, wherein the photovoltaic sheet is a flexible sheet.

3. The vehicle of claim 1, wherein the photovoltaic sheet comprises amorphous silicon.

4. The vehicle of claim 1, wherein the solar shade is configured to be deployed and retracted.

5. The vehicle of claim 4, wherein the solar shade is configured to be deployed automatically, using a motor powered by the electrical current generated by the photovoltaic sheet.

6. The vehicle of claim 1, wherein the transmissive panel is a side window, or a rear window, or a windshield, or a hatchback window, or a sunroof of the vehicle.

7. The vehicle of claim 1, wherein the electrical current powers the mobile device within the pocket via a wired connection with the solar shade.

8. The vehicle of claim 1, wherein the electrical current powers the mobile device inductively within the pocket.

9. The vehicle of claim 1, wherein the photovoltaic sheet includes a plurality of perforations for enhancing a visibility through the solar shade.

10. The vehicle of claim 1, wherein the power is provided to the mobile device using RF beams within the pocket.

11. A solar shade assembly for a vehicle, the solar shade assembly comprising:
a solar shade including a continuous photovoltaic sheet configured to generate an electrical current using sunlight; and a roller assembly including a housing for storing the photovoltaic sheet such that the photovoltaic sheet is capable of being unfurled from the roller assembly;

a pocket mounted on a surface of the photovoltaic sheet, wherein the pocket is configured to retain a mobile electronic device;

a power converter located in the roller assembly and configured to receive the electrical current;

wherein the power converter is configured to provide power to the pocket for charging a mobile device placed within the pocket; and wherein the power converter is configured to provide power to the roller assembly to drive furling of the photovoltaic sheet into the roller assembly housing.

12. The solar shade assembly of claim 11, wherein the photovoltaic sheet is a flexible sheet.

13. The solar shade assembly of claim 11, wherein the photovoltaic sheet comprises amorphous silicon.

14. The solar shade assembly of claim 11, wherein the solar shade is configured to be deployed and retracted.

15. The solar shade assembly of claim 11, wherein the solar shade is configured to be deployed automatically, using a motor powered by the electrical current generated by the photovoltaic sheet.

16. The solar shade assembly of claim 11, wherein the electrical current powers the mobile device within the pocket via a wired connection with the shade.

17. The solar shade assembly of claim 11, wherein the electrical current powers the mobile device inductively or using RF beams within the pocket.

18. The solar shade assembly of claim 11, wherein the photovoltaic sheet includes a plurality of perforations for enhancing a visibility through the solar shade.

19. The solar shade assembly of claim 11, wherein the power is provided to the mobile device using RF beams within the pocket.

* * * * *